United States Patent [19]
Ray et al.

[11] Patent Number: 5,552,725
[45] Date of Patent: Sep. 3, 1996

[54] LOW POWER, SLEW RATE INSENSITIVE POWER-ON RESET CIRCUIT

[75] Inventors: S. Doug Ray; Craig M. Peterson, both of Austin, Tex.

[73] Assignee: Advanced Micro Devices, Inc., Sunnyvale, Calif.

[21] Appl. No.: 286,685

[22] Filed: Aug. 5, 1994

[51] Int. Cl.$^6$ .................................................... H03K 17/22
[52] U.S. Cl. ............................ 327/143; 327/198; 327/81
[58] Field of Search .................................... 327/142, 143, 327/198, 284, 288, 80, 81

[56] References Cited

U.S. PATENT DOCUMENTS

| | | | |
|---|---|---|---|
| 4,633,107 | 12/1986 | Norsworthy | 327/198 |
| 5,039,875 | 8/1991 | Chang | 327/143 |
| 5,118,968 | 6/1992 | Douglas et al. | 327/81 |
| 5,149,990 | 9/1992 | Yamazaki et al. | 327/142 |
| 5,164,621 | 11/1992 | Miyamoto | 327/288 |
| 5,166,546 | 11/1992 | Savignac et al. | 327/198 |
| 5,180,926 | 1/1993 | Skripek | 327/143 |
| 5,287,011 | 2/1994 | Koshikawa et al. | 327/143 |

*Primary Examiner*—Timothy P. Callahan
*Assistant Examiner*—Eunja Shin
*Attorney, Agent, or Firm*—Kevin L. Daffer; Joseph P. Lally

[57] ABSTRACT

An improved power-on reset circuit is provided for controlling reset signal transition until after the power supply has achieved operational levels. Specifically, the reset signal is designated to transition from a high to a low state after the power supply exceeds a fixed reference voltage. The reference voltage is set at a voltage value greater than the operational voltage level of devices within a load circuit connected to the output of the power-on reset circuit. The power-on reset circuit includes numerous subcircuits used to define the reference voltage, trigger the reference voltage in relation to the power supply voltage, delay the triggered voltage, and buffer the delayed, triggered voltage to a reset value capable of driving load circuit impedances.

13 Claims, 4 Drawing Sheets

1

LOW POWER, SLEW RATE INSENSITIVE POWER-ON RESET CIRCUIT

BACKGROUND OF THE INVENTION

1. Field of the Invention

This invention relates to a power-on reset circuit and more particularly to a circuit for providing a reset pulse signal during initial power supply ramp-up, wherein the circuit operates at low current and is insensitive to changes in power supply slew rate.

2. Description of the Relevant Art

Most power supplies cannot instantly deliver a set (operable) power level to a circuit. Instead, the power supply ramps up power over a period of time, depending upon the load of the circuit. The circuit, therefore, should not become active until the power supply achieves operable power. During ramp-up, the circuit load is generally placed in a reset state and does not operate until after the reset period has passed.

There are many reasons for placing the circuit load in a reset state during power supply initiation. One reason is to ensure that the sequential logic within the circuit load is initialized to a known value. Initializing or "clearing" sequential logic circuits is necessary in order to adequately use those circuits. Another reason for resetting the load circuit is to prevent damage which might be caused by an undervoltage condition. By resetting or halting circuit operation, the load circuit purposefully waits until it receives operation level voltage before it begins operation.

Generation of a reset pulse signal is often achieved by passive and active devices, exemplary such devices are shown in reference to FIG. 1. Specifically, FIG. 1 illustrates a reset pulse signal ($V_{RST}$) generated from the active and passive devices and sent to a load circuit 10 which recognizes reset signals. $V_{RST}$ is driven from an active device 12, such as an amplifier with trigger capability. Active device 12 is stimulated by a biasing current 14. Biasing current 14 is generated through resistor $R_1$, initially through capacitor $C_1$ and eventually into active device 12. Accordingly, whenever the power supply (Vcc) ramps from zero voltage or ground to its operational level, biasing current 14 can be considerably high at the initial transient condition through capacitor $C_1$. If the input impedance on active device 12 is sufficiently low, biasing current 14 can achieve fairly high steady state value. If transients upon the power supply cause Vcc to transition negative, then diode $D_1$ will become forward biased and provide undervoltage protection.

A problem associated with many conventional reset generating circuits, such as that shown in FIG. 1, is the relatively high biasing current associated with its operation. Biasing current 14 exists not only at transient periods but also can occur and be quite high during steady state through active device 12 and/or load circuit 10. In applications where power consumption must be minimal, it is important that biasing current 14 be as small as possible. In particular, portable devices require that when in standby or non-operation mode, little or no current is drawn by the device. Thus, in situations where the load circuit is, for example, a laptop computer, minimal amounts of bias current 14 exists, and that the bias current which does exist is substantially less than conventional reset generating circuits which use resistor-capacitor passive components.

In addition to their consumption of large amounts of biasing current, conventional reset generating circuits (referred to herein as "power-on reset circuits") are often performance dependent upon the slew rate of the power supply. If, for example, the power supply slew rate is slow, then a possibility exists that the reset signal will terminate prior to the power supply ramping to an operational level. Using FIG. 2 as an illustrative example, two separate slew rates are shown: a fast slew rate 16 and a slow slew rate 18. The faster slew rate 16 is indicative of a faster rate of turn-on of power supply Vcc. The slower slew rate 18 illustrates a slower turn-on rate. Using conventional resistor-capacitor elements, the reset period is timed directly proportional to the resistor and capacitor values. Reset period 20 is of a fixed amount, followed by a non-reset period 22. Reset transitions at an RC time constant of $t=R_1C_1$, and that the transition point is the same regardless of the power supply slew rate. If the power supply follows slow slew rate 18, reset is shown to terminate prior to Vcc reaching an operational level $V_{OP}$. Thus, slow slew rate 18, which triggers at $V_{TS}$, has not yet allowed the power supply to reach operational levels. As a result, the load being driven by the power supply prematurely turns on—leading to improper load operation. If the slew rate is fast, as in curve 16, then the premature turn-on problem is not so severe. In most cases, a fast slew rate power supply will reach operational levels before reset has ended.

The problems of improper operation caused by premature reset transition generally occurs whenever reset transitions are fixed from a defined time constant. The time constant may work well with power supplies having faster slew rates, but are inadequate with power supplies having slower slew rates. From the standpoint of slew rate variability, it would be desirable to redesign the power-on reset circuit to accept variability in power supply slew rates. Additionally, the power-on reset circuit must be redesigned with minimal biasing current during transition periods and during periods of steady state.

SUMMARY OF THE INVENTION

The problems outlined above are in large part solved by the power-on reset circuit of the present invention. That is, power-on reset circuit hereof does not require a biasing current, or passive resistive and capacitive components. Any current which exists within the present power-on reset circuit occurs primarily as subthreshold leakage current and is substantially less than the transition or steady state current levels of conventional reset circuits. Additionally, the present reset signal is transitioned not at a fixed time amount, but at variable time dependent upon the power supply slew rate. The variable time values are defined from a reference voltage ($V_{REF}$). The reference voltage is fixed and is correlated to the slew rate curves, such that the reference voltage interpolates to a shorter time value for faster slew rate power supplies and a longer time value for slower slew rate power supplies. Using a fixed reference voltage instead of a fixed RC time constant, reset transitions occur at a known voltage value purposefully greater than voltages necessary for proper load operability. Transitions at $V_{REF}$, or a short time delay thereafter, ensure that the power-on reset circuit will de-activate the reset signal after the power supply exceeds load operation levels. By fixing the transition point at a voltage level rather than a time period, the power-on reset circuit is slew rate independent.

Broadly speaking, the present invention contemplates a power-on reset circuit. The power-on reset circuit comprises a reference voltage circuit including a power-on clamping transistor and a power-off clamping transistor connecting in parallel between a ground voltage and a reference voltage.

The power-on reset circuit further includes a trigger circuit having a gate terminal of a trigger transistor connected to receive the reference voltage and, based upon the voltage magnitude of the reference voltage relative to a power supply voltage, the trigger transistor is adapted to produce a trigger voltage. A multiple stage delay circuit is adapted to receive the trigger voltage. The multiple stage delay circuit includes a delay output which transitions a timed duration after the delay circuit receives the trigger voltage. The power-on reset circuit further includes an output driver connected to receive the delay output and produce an inverted delay output signal corresponding to a reset pulse signal ($V_{RST}$).

The present invention further contemplates, a power-on reset circuit comprising a plurality of series-connected pairs of n-channel and p-channel transistors. Each pair of transistors is coupled between a power supply voltage and a ground voltage. The power-on reset circuit further includes means for increasing the power supply voltage above the ground voltage and for activating a fixed reference voltage at a time after which the power supply voltage exceeds the ground voltage by a threshold amount. Prior to and during activation of the reference voltage, at least one of each pair of transistors is maintained in an off state such that a steady state current typically less than 100 picoamperes exists between the power supply voltage and the ground voltage. The steady state current is, however, process dependent, wherein CMOS process generally encounters a 100 picoamperes steady state current.

BRIEF DESCRIPTION OF THE DRAWINGS

Other objects and advantages of the invention will become apparent upon reading the following detailed description and upon reference to the accompanying drawings in which.

Figure 1:
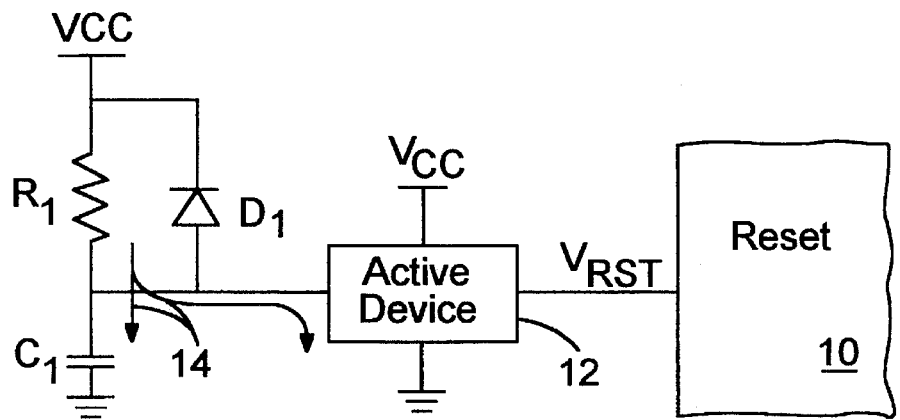
FIG. 1 is a power-on reset circuit according to a prior design.
Figure 2:
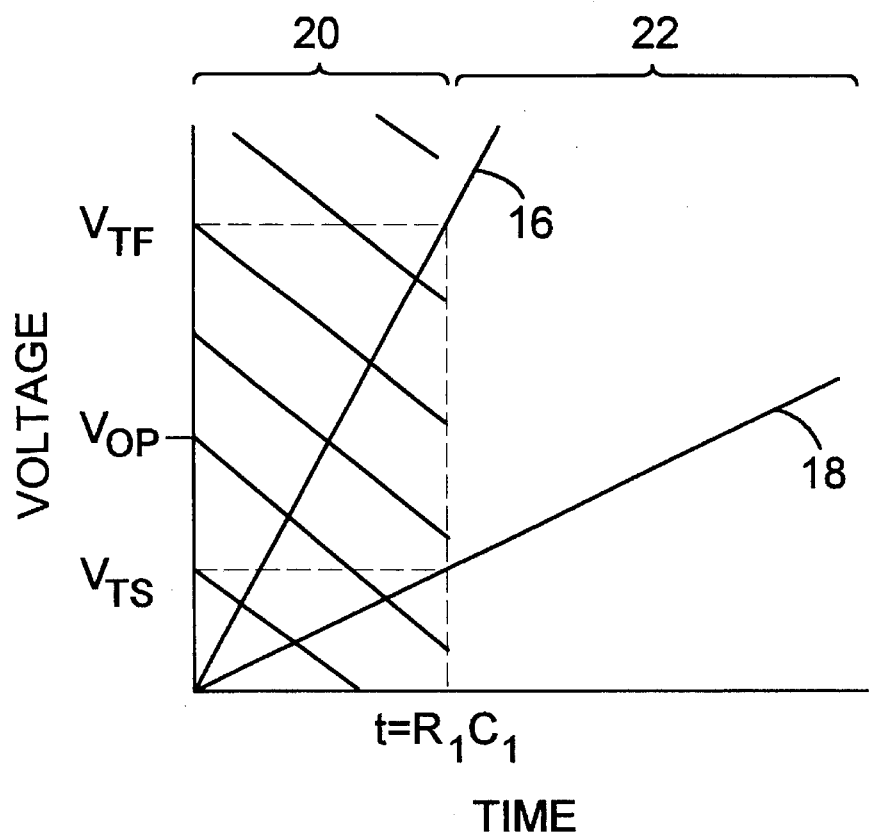
FIG. 2 is a graph of voltage versus time for a reset transition occurring at a fixed time for dissimilar power supply slew rates according to the prior design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 3:
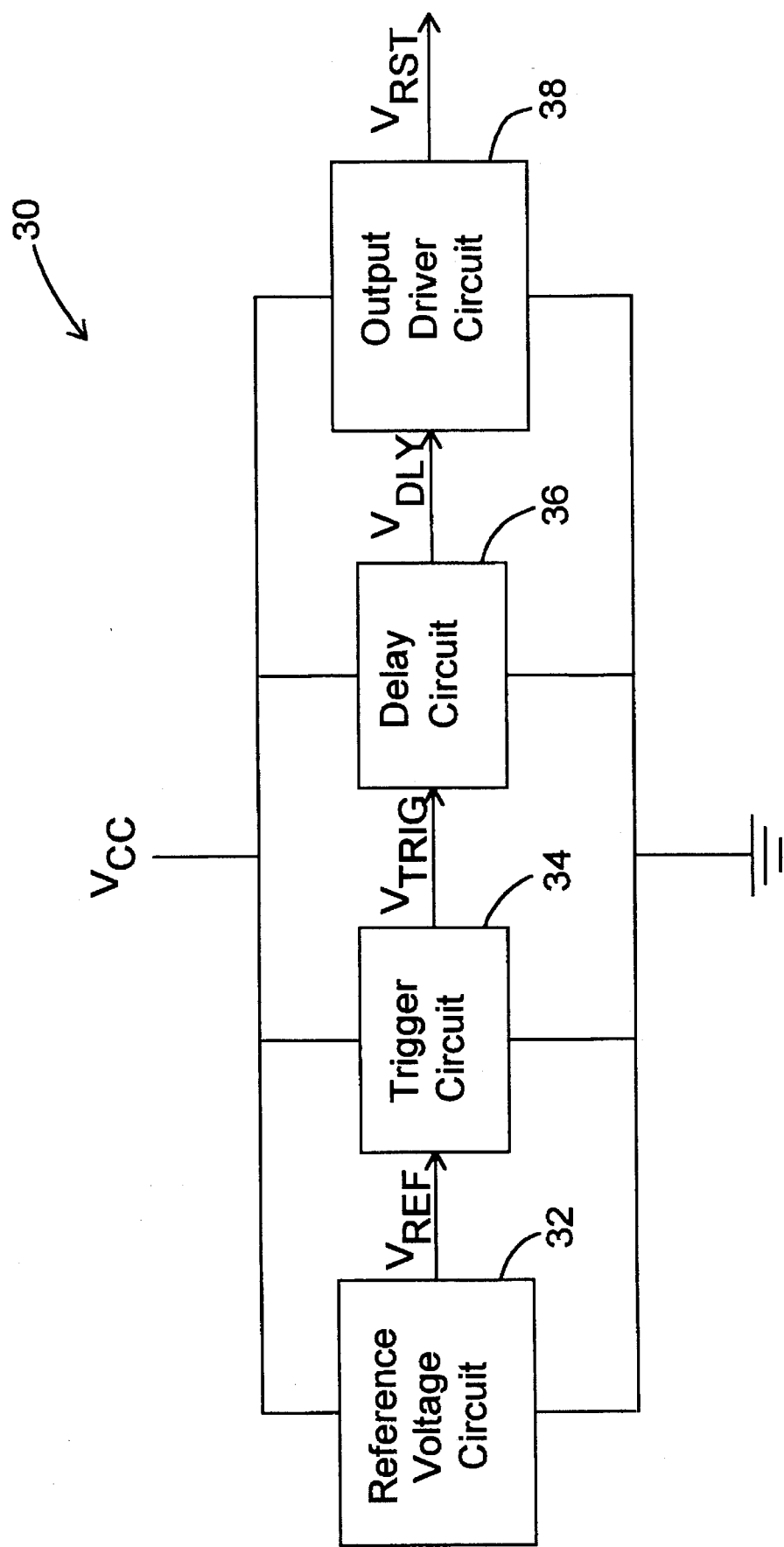
FIG. 3 is a block diagram of a power-on reset circuit according to the present invention.

Turning now to FIG. 3, a block diagram of power-on reset circuit 30 of the present invention is shown. Power-on reset circuit 30 includes a plurality of sub-circuits: reference voltage circuit 32, trigger circuit 34, delay circuit 36 and output driver circuit 38. Reference voltage circuit 32 takes a power supply input (Vcc) and, based on that input, generates a reference voltage ($V_{REF}$). At power supply voltages below a threshold amount, $V_{REF}$ tracks Vcc, and at all voltages above the threshold amount $V_{REF}$ is fixed. Trigger circuit 34 receives $V_{REF}$ and compares $V_{REF}$ with Vcc. Based upon that comparison, a trigger voltage ($V_{TRIG}$) is produced. The $V_{TRIG}$ can be a relatively high voltage level (equal to that of Vcc), and $V_{TRIG}$ propagates through delay circuit 36. Delay circuit 36 produces a delayed output voltage ($V_{DLY}$) which transitions a timed duration after $V_{TRIG}$ transitions. Output driver circuit 38 is preferably an invertor/buffer arrangement which receives $V_{DLY}$ and buffers the output to reset levels ($V_{RST}$).

Figure 4:
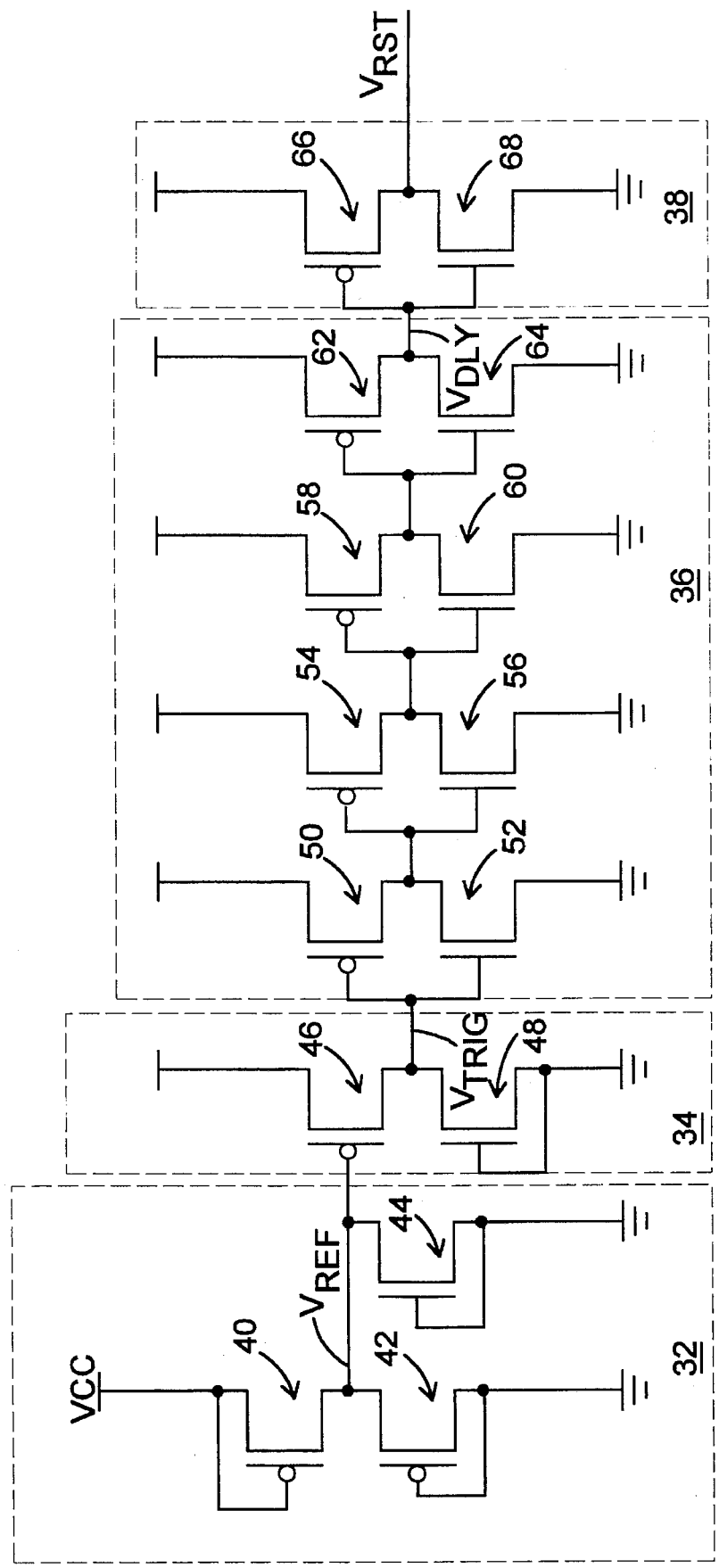
FIG. 4 is a circuit schematic of the power-on reset circuit according to the present invention.

Referring now to FIG. 4, power-on reset circuit 30 includes circuits 32, 34, 36 and 38, shown at the transistor level. As shown, all of the devices of circuit 30 are active devices without dedicated resistor and capacitor elements as in many conventional designs. In particular, the active devices (transistors) are metal oxide semiconductor (MOS) devices. More preferably, the transistors are complementary metal oxide semiconductor (CMOS) devices. Reference voltage circuit 32 comprises a first p-channel transistor 40, a second p-channel transistor 42 and a first n-channel transistor 44. First p-channel transistor 40 has its gate and source regions coupled together in an off state. Conversely, second p-channel transistor 42 has its gate and drain regions tied together in an on state, and provides a power on clamping function. By making the connections as shown, second p-channel transistor 42 assures $V_{REF}$ is placed at one threshold level above ground during times when Vcc rises to a value above threshold. Threshold is defined as the p-channel threshold voltage necessary to begin turn on of a p-channel transistor. First p-channel transistor 40 remains in an off state during ramp-up of Vcc. Only small amounts of subthreshold leakage current will exist through the source and drain path of p-channel transistor 40 and n-channel transistor 44.

Subthreshold leakage current exists within the picoamperes range throughout the time in which Vcc is ramped upward. If Vcc is ramped downward or discharged, previously established $V_{REF}$ voltage is forced toward a negative range. In such instances, first n-channel transistor 44 turns from its normally off configuration (gate and source regions connected) to a normally on configuration where source becomes drain. In an on configuration, first n-channel transistor 44 ensures that $V_{REF}$ will not ramp downward below ground potential by more than one threshold amount. First n-channel transistor 44 thereby provides a power off clamping function. Thus, transistors 40 through 44 ensure a reference voltage, $V_{REF}$, which is ramped upward to a fixed amount, and is clamped to near grond potential during power-off conditions. Furthermore, during ramp-up and ramp-down of Vcc, a direct (low resistance) path between Vcc and ground is not allowed to exist. Transition or steady state current is limited to subthreshold leakage amounts never exceeding the picoamp range.

With $V_{REF}$ established at a fixed amount, trigger circuit 34 triggers from the $V_{REF}$ voltage and produces a trigger voltage, $V_{TRIG}$. Specifically, $V_{REF}$ is input to the gate terminal of a third p-channel transistor 46. If $V_{REF}$ is less than Vcc by a p-channel threshold amount, then $V_{TRIG}$ will be pulled high (will equal Vcc). Second n-channel transistor 48 is coupled in an off state with the gate and source regions tied together. Transistor 48 thereby achieves low conductance between the source and drain regions with subthreshold leakage in the picoamperes range. Transistor 48 is used to stabilize $V_{TRIG}$ during reset conditions. $V_{TRIG}$ at the output of trigger circuit 34 is fed into delay circuit 36. Delay circuit 36 comprises at least two stages, and preferably four stages of invertors. The first stage of invertors includes fourth p-channel transistor 50 and third n-channel transistor 52 connected as an inverter. The second stage includes fifth p-channel transistor 54 and fourth n-channel transistor 56 connected as an inverter. The third stage includes sixth p-channel transistor 58 and fifth n-channel transistor 60 connected as an inverter. The fourth stage includes seventh p-channel transistor 62 and sixth n-channel transistor 64 connected as an inverter. There may be additional stages, either as an odd or even number of stages beyond two or beyond four. Regardless of the number of stages used, the first stage fourth p-channel transistor 50 is sized larger than third n-channel transistor 52. By sizing transistor 50 gate widths greater than transistor 52, the turn-on speed of transistor 50 will exceed that of transistor 52. If the $V_{TRIG}$ is at a high level (approximately equal to Vcc), then transistor 52 will turn-on, but at a slower rate than if transistor 50 were to turn-on. Accordingly, by scaling the sizes of each stage within delay circuit 36, resulting pull-up will have a dissimilar time period to that of a pull down operation. First as well as second and subsequent stages turn-on the weaker devices slower than the stronger devices. By making transistors 50, 56, 58 and 64 stronger than transistors 52, 54, 60 and 62, delay circuit 36 transitions after a delay period from a relatively high $V_{TRIG}$ signal to a relatively high $V_{DLY}$ signal. However, when $V_{TRIG}$ is low (near ground voltage) the stronger transistors 50, 56, 58 and 64 turn-on quickly causing rapid transition of $V_{DLY}$.

Resulting $V_{DLY}$ signal achieves at least a minimum delay time. A high voltage level delay signal occurs when Vcc exceeds $V_{REF}$ by a threshold amount. In order to provide an absence of reset signal during this time in which Vcc is greater than $V_{REF}$, the delay voltage must be inverted and buffered through output driver circuit 38. Driver circuit 38 includes eighth p-channel transistor 66 and seventh n-channel transistor 68. Transistor 66 and 68 are connected as an invertor, and receives $V_{DLY}$ signals at the gate terminals. The inverted, buffered output is presented as reset signal, $V_{RST}$. $V_{RST}$ occurs whenever Vcc is less than a threshold value above $V_{REF}$. Thus, during power-on situations where Vcc is minimal, reset pulse signal, $V_{RST}$, will be exerted. Delay circuit 36 thereby achieves a greater delay of a high level $V_{TRIG}$ signal than a low $V_{TRIG}$ signal.

Figure 5:
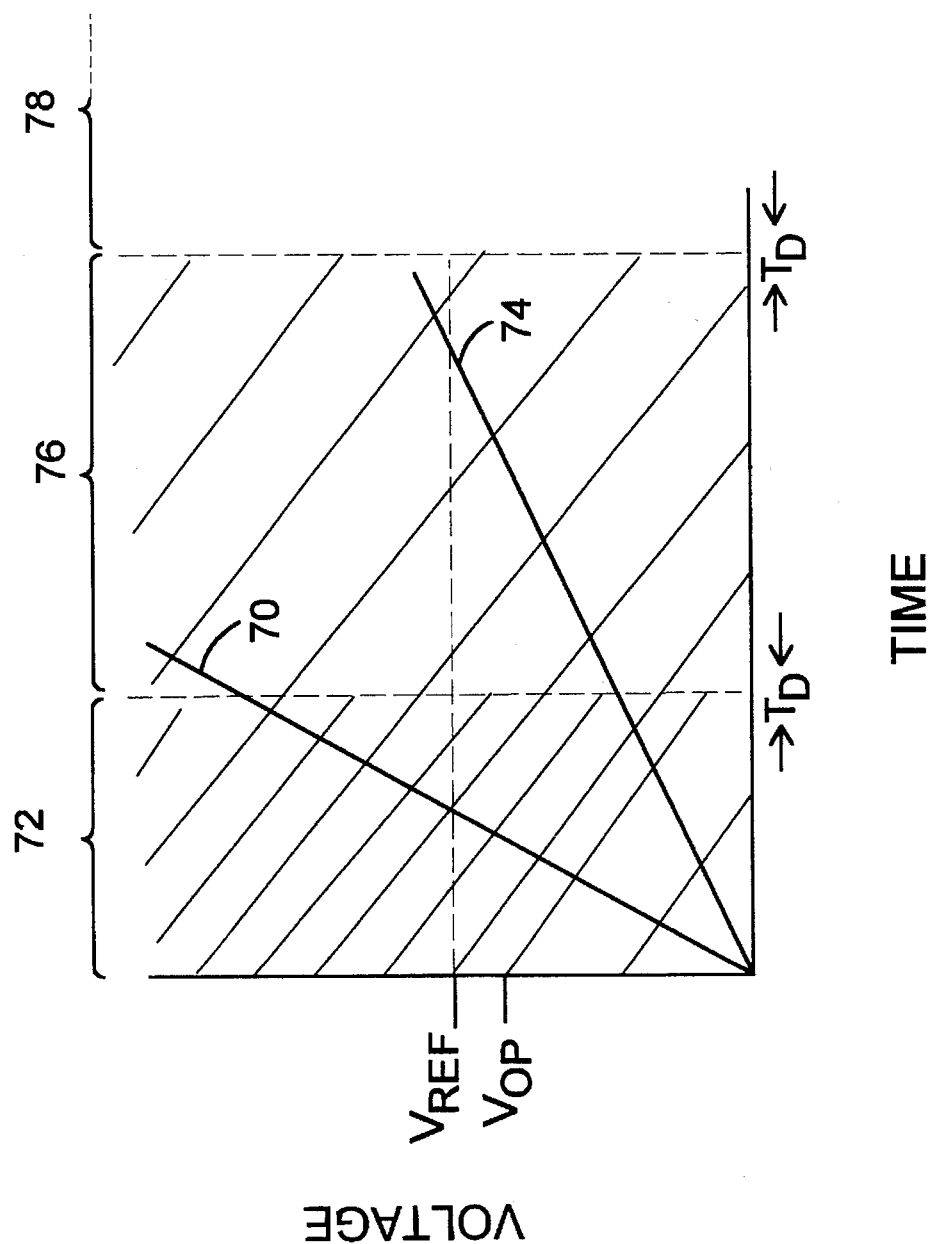
FIG. 5 is a graph of voltage versus time for a pair of reset transitions occurring at dissimilar times corresponding to dissimilar power supply slew rates.

Referring now to FIG. 5, reset signal, $V_{RST}$, occurs at time periods dependent upon the slew rate of the power supply Vcc. If Vcc ramps quickly upward as shown by fast slew rate 70, then once it exceeds $V_{REF}$ by a threshold amount, and after a certain delay period $T_d$, the reset signal $V_{RST}$ transitions from a high level to a low level. Time period 72 indicates a high level reset signal. After time period 72, reset signal goes low and no longer exists. Using a slow slew rate 74 example, once Vcc exceeds $V_{REF}$ by a threshold amount and for a delay time period thereafter, reset signal transitions from a high state to a low state. Prior to the transition time, reset signal is active high as indicated by the combination of time periods 72 and 76. After time periods 72 and 76 have expired, neither the fast or the slow slew rates power supplies exhibit a reset signal, as shown during period 78, at the output of the power-on reset circuit 30. In all instances, reset transitions at a time period after which Vcc exceeds an operational level ($V_{OP}$). By selecting the trip point ($V_{REF}$) greater than $V_{OP}$, circuit 30 is assured that reset transitions at a time which is independent of the time it takes to ramp-up the power supply.

It will be appreciated to those skilled in the art having the benefit of this disclosure that this invention is capable of applications with numerous types of load circuits. Furthermore, it is to be understood that the form of the invention shown and described is to be taken as a presently preferred embodiment. Various modifications and changes may be made to each subcircuit and particularly to each stage of the delay circuit or to additional stages provided to the delay circuit, all as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A power-on reset circuit comprising:

a reference voltage circuit including a power on clamping transistor and a power off clamping transistor connected in parallel a ground voltage and a reference voltage having a reference voltage value, said reference voltage circuit further includes an off-state connected transistor coupled between said reference voltage terminal and a power supply voltage terminal;

a trigger circuit having a gate terminal of a trigger transistor connected to receive a fixed voltage value upon said reference voltage terminal which is based on the magnitude of said reference voltage value relative to said power supply voltage, wherein said trigger transistor is adapted to produce a trigger voltage;

a multiple stage delay circuit having an input adapted to receive said trigger voltage and a delay output which transitions a timed duration thereafter; and an output driver connected to receive said delay output and produce an inverted delay output signal corresponding to a reset signal.

2. The power-on reset circuit as recited in claim 1, wherein said off-state connected transistor comprises a source, a drain and a gate, and wherein the gate and source regions are coupled together.

3. A power-on reset circuit comprising:

a reference voltage circuit including a power on clamping transistor and a power off clamping transistor connected in parallel between a ground voltage and a reference voltage terminal having a reference voltage value, wherein a conductive path formed by said power on clamping transistor is of greater conductivity than a conductive path formed by said power off clamping transistor during times in which a power supply voltage is increased above said ground voltage;

a trigger circuit having gate terminal of a trigger transistor connected to receive a fixed voltage value upon said reference voltage terminal which is based on the magnitude of said reference voltage value relative to said power supply voltage, wherein said trigger transistor is adapted to produce a trigger voltage;

a multiple stage delay circuit having an input adapted to receive said trigger voltage and a delay output which transitions a timed duration thereafter; and an output driver connected to receive said delay output and produce an inverted delay output signal corresponding to a reset signal.

4. A power-on reset circuit comprising:

a reference voltage circuit including a power on clamping transistor and a power off clamping transistor connected in parallel between a ground voltage and a reference voltage terminal having a reference voltage value wherein a conductive path formed by said power off clamping transistor is of greater conductivity than a conductive path formed by said power on clamping transistor during time in which a power supply voltage is decreased to said ground voltage;

a trigger circuit having a gate terminal of a trigger transistor connected to receive a fixed voltage value upon said reference voltage terminal which is based on the magnitude of said reference voltage value relative to said power supply voltage, wherein said trigger transistor is adapted to produce a trigger voltage;

a multiple stage delay circuit having an input adapted to receive said trigger voltage and a delay output which transitions a timed duration thereafter; and an output driver connected to receive said delay output and produce an inverted delay output signal corresponding to a reset signal.

5. A power-on reset circuit comprising:

a reference voltage circuit including a power on clamping transistor and a power off clamping transistor connected in parallel between a ground voltage and a reference voltage terminal having a reference voltage value;

a trigger circuit having a gate terminal of a trigger transistor connected to receive a fixed voltage value upon said reference voltage terminal which is based on the magnitude of said reference voltage value relative to a power supply voltage, wherein said trigger transistor is adapted to produce a trigger voltage and wherein said trigger circuit further includes an off-state connected transistor coupled between said trigger voltage and said ground voltage;

a multiple stage delay circuit having an input adapted to receive said trigger voltage and a delay output which transitions a timed duration thereafter; and an output driver connected to receive said delay output and produce an inverted delay output signal corresponding to a reset signal.

6. A power-on reset circuit comprising:

a reference voltage circuit including a power on clamping transistor and a power off clamping transistor connected in parallel between a ground voltage and a reference voltage terminal having a reference voltage value;

a trigger circuit having a gate terminal of a trigger transistor connected to receive a fixed voltage value upon said reference voltage terminal which is based on the magnitude of said reference voltage value relative to a power supply voltage, wherein said trigger transistor is adapted to produce a trigger voltage whenever said reference voltage value is less than a threshold amount below said power supply voltage;

a multiple stage delay circuit having an input adapted to receive said trigger voltage and a delay output which transitions a timed duration thereafter; and an output driver connected to receive said delay output and produce an inverted delay output signal corresponding to a reset signal.

7. A power-on reset circuit, comprising:

a first p-channel transistor coupled in an off state between a power supply voltage and a reference voltage;

a second p-channel transistor coupled in an on state in parallel with a first n-channel transistor coupled in an off state, said second p-channel transistor and said first n-channel transistor are coupled between said reference voltage and a ground voltage;

a third p-channel transistor coupled to receive at a gate terminal said reference voltage and to activate a trigger voltage during times in which said reference voltage is less than a threshold amount below said power supply voltage;

a first inverter and second inverter connected in series, wherein said first inverter is adapted to receive said trigger voltage and said second inverter is adapted to produce a delay output a fixed time period after the arrival of said trigger voltage; and a third inverter of larger gate size than said second inverter connected to said second inverter to receive said delay output and to boost said delay output drive level to a reset signal.

8. The power-on reset circuit as recited in claim 7, wherein said first p-channel transistor and said first n-channel transistor each includes a source, a drain and a gate, and wherein the source and gate are connected together in said off state.

9. The power-on reset circuit as recited in claim 7, wherein said second p-channel transistor includes a source, a drain and a gate, and wherein the drain and gate are connected together in said on state.

10. The power-on reset circuit as recited in claim 7, further comprising a second n-channel transistor having a source, a drain and a gate, and wherein the source and gate are coupled together in an off state, and further wherein the drain is coupled to said trigger voltage.

11. A power-on reset circuit, comprising:

a plurality of series-connected pairs of n-channel and p-channel transistors, each pair of transistors is coupled between a power supply voltage and a ground voltage;

a trigger circuit coupled to an input of said series-connected pairs of n-channel and p-channel transistors;

a reference voltage circuit coupled to an input of said trigger circuit for activating a fixed reference voltage at a time after which said power supply voltage exceeds said ground voltage by a threshold amount; and said fixed reference voltage is chosen for maintaining at least one of each pair of transistors in an off state such that a steady state current of about 100 picoamperes exists between said power supply voltage and said ground voltage.

12. The power-on reset circuit as recited in claim 11, wherein said trigger circuit comprises a gate terminal of a trigger transistor connected to receive said reference voltage and to produce a trigger voltage whenever said reference voltage is less than a threshold voltage below said power supply voltage.

13. The power-on reset circuit as recited in claim 12, wherein said plurality of series-connected pairs of n-channel and p-channel transistors comprises a multiple stage delay circuit connected to receive said trigger voltage.

* * * * *

UNITED STATES PATENT AND TRADEMARK OFFICE
CERTIFICATE OF CORRECTION

PATENT NO. : 5,552,725

DATED : September 3, 1996

INVENTOR(S) : S. Doug Ray and Craig M. Peterson

It is certified that error appears in the above-indentified patent and that said Letters Patent is hereby corrected as shown below:

In the Claims:

Claim 1, col. 6, line 18, please insert --between-- after parallel.

Signed and Sealed this

Twenty-fifth Day of November, 1997

Attest:

BRUCE LEHMAN

Attesting Officer

Commissioner of Patents and Trademarks